(12) United States Patent
Molnar

(10) Patent No.: US 6,262,623 B1
(45) Date of Patent: Jul. 17, 2001

(54) LOG-DOMAIN FILTER HAVING A VARIABLE DYNAMIC RANGE WINDOW

(75) Inventor: Alyosha C. Molnar, Costa Mesa, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/322,401

(22) Filed: May 28, 1999

(51) Int. Cl.⁷ ........................................... H03B 1/00
(52) U.S. Cl. ............................. 327/552; 327/553
(58) Field of Search ..................... 327/552, 553, 327/555, 557, 558, 559, 350, 351, 352

(56) References Cited

U.S. PATENT DOCUMENTS

| | | | |
|---|---|---|---|
| 5,227,732 | * 7/1993 | Hong | 328/167 |
| 5,606,280 | * 2/1997 | Sohn | 327/553 |
| 5,694,077 | * 12/1997 | Fuller | 327/552 |
| 6,051,997 | * 4/2000 | Yeung et al. | 327/58 |

OTHER PUBLICATIONS

"A Compact Low Power BiCMOS Class AB Log–Domain Filter", M. Punzenberger & C. Enz, *IEEE J. Solid–State Ciruits*, vol. 33, No. 7, pp. 1123–1129, Jul. 1998.

"A 1.2–V Low–Power BiCMOS Class AB Log–Domain Filter", M. Punzenberger & C. Enz, *IEEE J. Solid–State Circuits*, vol. 32, No. 12, Dec., 1997.

"Analysis and Design of Analog Integrated Circuits", P. Gray & R. Meyer, $3_{rd}$ Ed., pp. 230–244, 1993.

"Log–Domain Filters Based on LC Ladder Synthesis", D. Perry & G.W. Roberts, McGill University, Montreal Canada.

"Analysis of Noise in Translinear Filter", J. Mulder, M.H.L. Kouwenhoven, W.A. Serdijn, A.C. van der Woers & A.H.M. van Roermund, Delft University of Technology, The Netherlands.

* cited by examiner

*Primary Examiner*—Kenneth B. Wells
*Assistant Examiner*—Paul Dinh
(74) *Attorney, Agent, or Firm*—Lyon & Lyon LLP

(57) ABSTRACT

A filter system having a variable dynamic range window comprising a parameter detector, a biasing unit and an active filter network. In one implementation, the active filter network comprises a log-domain filter. The parameter detector is configured to detect a parameter of a signal. The biasing unit, responsive thereto, biases the incoming signal. In one implementation, the biasing unit biases the signal to avoid zero crossings thereof. The effect is to adjust the dynamic range window of the filter to achieve an effective dynamic range which is greater than the nominal dynamic range.

15 Claims, 14 Drawing Sheets

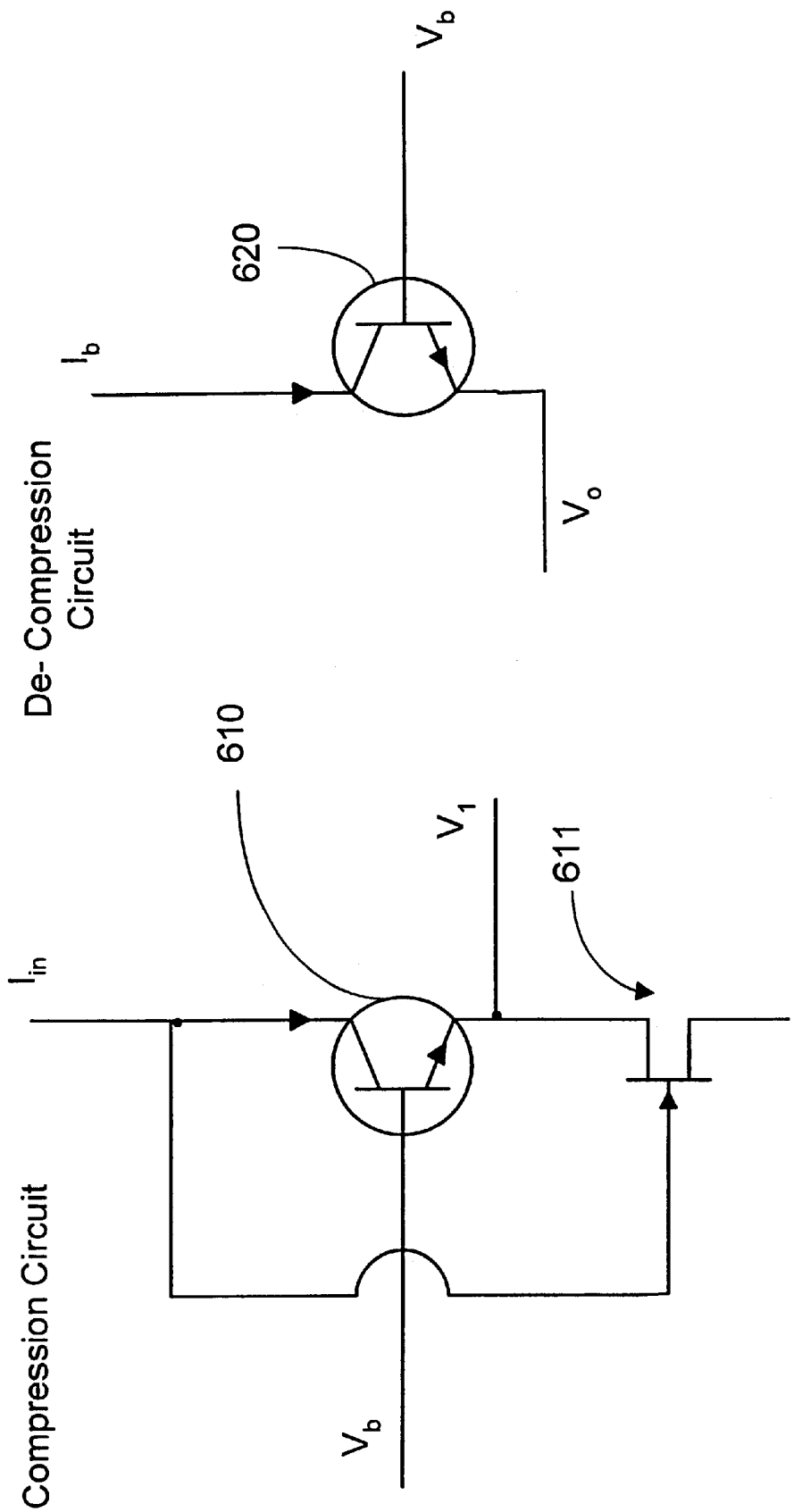

LOG-DOMAIN FILTER HAVING A VARIABLE DYNAMIC RANGE WINDOW

BACKGROUND OF THE INVENTION

1. Field of the Invention

This invention relates generally to log-domain filters and in particular to a biasing system for a log-domain filter having a variable dynamic range window.

2. Background

In wireless communications systems, such as those employing the CDMA IS-95A, -95B, -95C standards, there is typically a wide variation in the amplitude of signals transmitted between the mobile units and the handsets thereof caused by various factors such as slow and fast fading. In many cases, the range in amplitude in such systems can exceed 60 dB. Consequently, the filters used in such systems must have sufficient dynamic range to handle the wide variability of signals which are present. Even in systems employing closed loop power control, such as CDMA wireless communications systems, there are circumstances in which a wide dynamic range filter is required.

The problem is that there are limits in the amount of current or voltage swing current active filters can handle and still remain linear. In traditional filters, such as gmC filters, the dynamic range can only be increased through increased power consumption and die area. For example, traditional methods for increasing the dynamic range involve either the introduction of larger degeneration resisters on the emitters of differential pairs, which is wasteful of die area, or higher bias currents, which is wasteful of power. Furthermore, the range is fixed by the design, and cannot be varied to accommodate signals of widely varying amplitude. Consequently, the power consumption in such filters is always set to accommodate worst-case scenarios, making the consumption wasteful at all other times.

One class of filters that have been proposed in response to the demands presented by modem communication systems is log-domain filters. See, e.g., M. Punzenberger & C. Enz, "A Compact Low-Power BiCMOS Log-Domain Filter", *IEEE J Solid-State Circuits*, vol. 33, no. 7, pp. 1123–1129, July, 1998; M. Punzenberger & C. Enz, "A 1.2-V Low-Power BiCMOS Class AB Log-Domain Filter," *IEEE J Sold-State Circuits*, vol. 32, no. 12, December, 1997, both of which are hereby fully incorporated by reference herein as though set forth in full.

Log-domain filters typically comprise a logarithmic integrator sandwiched between a logarithmic compressor at the input, and an exponential expander at the output. An incoming signal is compressed into the log domain, filtered while in the log domain, and then exponentially expanded. Log-domain filters, because they operate on signals in the log domain, can handle signals having large swings in amplitude. Moreover, despite their internal non-linearity, log-domain filters achieve linearity from an overall standpoint.

The problem is that the dynamic range of log-domain filters cannot achieve a dynamic range of greater than about 60–70 dB. The reason is that the noise floor of a log-domain filter, which defines the lower bound of the dynamic range, rises and falls as the compression point, which defines the upper bound of the dynamic range, rises and falls. Consequently, the dynamic range, which is defined as the range between the compression point and the noise floor, is substantially invariant to changes in the compression point. The dynamic range thus remains at its nominal level of about 60–70 dB. Thus, these filters are not suitable for general use in wireless communications systems, particularly wireless communications systems where very wide dynamic range is required.

Switchable RC filters offer a wide dynamic range, but the transfer function thereof is subject to numerous, discontinuous jumps as components switch in and out of the filter during tuning. Such discontinuities render the switchable RC filter unsuitable for general use in wireless communications systems. In addition, such filters consume a large die area.

Other tunable filters comprise gmC filters. However, like log domain filters, gmC filters are limited to a 60–70 dB dynamic range.

Thus, there is a need for a tunable filter which overcomes the disadvantages of the prior art.

SUMMARY OF THE INVENTION

In accordance with the purpose of the invention as broadly described herein there is provided a filter system comprising a parameter detector, adjuster and a variable dynamic range window filter. The parameter detector detects a parameter of a signal, and the adjuster, responsive to the detected parameter, adjusts the dynamic range window, that is, the range of operation defined by the 1 dB compression point and the noise floor, of the filter. The result is to achieve an effective dynamic range for the filter system which is greater than the nominal dynamic range.

In one embodiment, the parameter detector is a peak detector, and the adjuster is a biasing unit. In this embodiment, the peak detector detects a peak of a signal, and the biasing unit, responsive thereto, biases the signal in order to increase the effective dynamic range of the filter system. In one implementation, the signal is a differential mode signal, and the biasing unit biases the common mode component of the signal responsive to the detected peak. In one implementation example, the filter is a log-domain filter, and the biasing unit biases the common mode component of the signal to avoid zero crossings thereof. In this implementation, the logarithm of zero or negative numbers is undefined, and the biasing unit, by biasing the signal to avoid zero crossings thereof, adjusts the compression point of the filter responsive to the detected peak. Since the compression point defines the upper limit to the dynamic range of the filter, the effect is to shift the dynamic range window, that is, the range of operation defined by the 1 dB compression point and the noise floor, to achieve a greater effective dynamic range even though the instantaneous dynamic range, that is, the difference between the 1 dB compression point and the noise floor, is unchanged.

In one implementation, the filter is a current mode filter in contrast to a voltage mode filter. Operation in the current mode is advantageous because, unlike the voltage mode, the power supply voltage does not set an upper limit to the 1 dB compression point.

In one embodiment, the filter comprises a compressor, an integrator, and a decompressor coupled together in a cascade arrangement. In this arrangement, the filter has an overall transfer function which is that of a linear low pass filter. Thus, even though the internal workings of the filter are intentionally non-linear, the overall transfer function of the filter is linear.

In a second embodiment, the filter comprises a plurality of filter blocks, each of which comprises a compressor, an integrator, and a decompressor coupled together in a cascade arrangement. In this embodiment, the filter blocks are configured to achieve a desired transfer function, whether that of a baseband, passband, bandpass, high pass or other filter. In one implementation, in which each of the filter blocks is a log-domain filter, the log-domain outputs of one filter block are provided directly to the integrator of a second filter block in order to avoid unnecessary decompression and recompression operations. In this implementation, the decompressor of the first filter block, and the compressor of the second filter block, are bypassed.

One embodiment of the method embodying the subject invention comprises the steps of detecting a parameter of a signal, biasing the signal responsive to the detected parameter, and then filtering the biased signal in the log domain. In one implementation, the method further comprises detecting a peak of the signal, and biasing the signal responsive thereto. In one example, the method further comprises biasing the common mode component of a differential mode signal responsive to the detected peak to avoid zero crossings thereof.

Other features and advantages of the invention, as well as the structure and operation of particular embodiments of the invention, are described in detail below with reference to the accompanying drawings.

BRIEF DESCRIPTION OF THE DRAWINGS

FIG. 12 illustrates an embodiment of a compressor in accordance with the subject invention.

FIG. 13 illustrates an embodiment of a decompressor in accordance with the subject invention.

DETAILED DESCRIPTION OF THE PREFERRED EMBODIMENTS

1. Example Environment & Description of First Embodiment of Subject Invention

Figure 1:
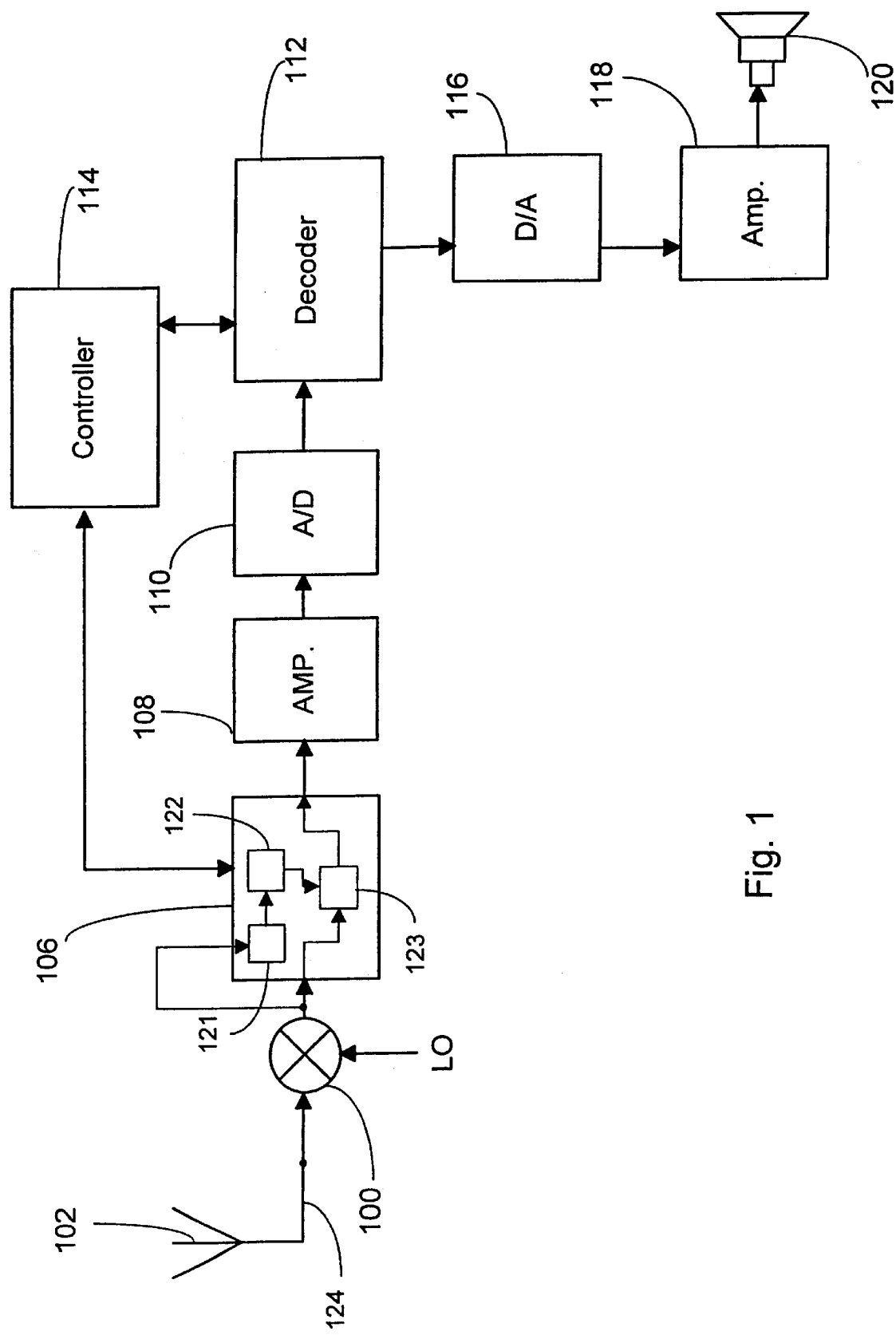
FIG. 1 illustrates a block diagram of first embodiment of the subject invention in the context of an example environment.

Although other applications are possible, one example environment in which the subject invention can be implemented is within a wireless communications receiver, such as that illustrated in FIG. 1. In such a receiver, a radio frequency (RF) signal is received over antenna 102 and provided to mixer 100. Mixer 100 mixes the received signal with a signal from a local oscillator (LO), to thereby downconvert the signal to baseband frequencies in one or more stages. The baseband signal is then passed through filter system 106, and the filtered signal then amplified by amplifier 108. The amplified signal is then digitized by A/D converter 110, and the digitized signal decoded by decoder 112. A controller 114 is provided to synchronize the operations performed by filter system 106, and decoder 112. The decoded signal is then passed through D/A converter 116, resulting in an analog signal. The analog signal is then amplified by amplifier 118, and the amplified signal provided to speaker 120. In an alternative embodiment, the decoder 112 may provide the digitized signal to a CODEC (not shown) for voice synthesis or to data processing hardware (not shown).

The filter system 106 is configured in accordance with the subject invention. In a first embodiment, the filter system includes parameter detector 121 for measuring a parameter of the signal received on signal line 124, a filter 123, and bias circuit 122 for adjusting the bias level of the filter responsive to the parameter detected by the parameter detector. In this manner, the dynamic range window, that is, the range of operation defined by the 1 dB compression point and the noise floor, is shifted responsive to the detected parameter even though the instantaneous dynamic range is unchanged. Consequently, an effective dynamic range is achieved which is greater than the nominal dynamic range of the filter.

When presented with a sufficiently large signal, the dynamic range window will be shifted upward to ensure that the compression point of the filter will be higher than the signal. When presented with a small signal, the dynamic range window will be shifted downward, ensuring that the noise floor will be lower than the signal. Hence, the filter can handle a larger range of signal strengths than if the window had been constant.

In one implementation, the parameter detector is a peak detector, and the parameter which is detected is the peak of the received signal. The filter in this implementation is a log-domain filter, an inherently tunable filter. In addition, this log-domain filter is a differential input filter, and the bias circuit in this implementation sets the level of the common mode of the differential input to the filter responsive to the detected peak so that zero crossings of the differential input are avoided. By adjusting the common mode component of the input signal to avoid zero crossings in the differential input signal, the 1 dB compression point zero crossing is raised or lowered depending on the level of the detected peak. The effect is to shift the dynamic range window responsive to the detected peak, thereby increasing the effective dynamic range of the filter even though the instantaneous dynamic range is unchanged. According to this implementation, an effective dynamic range of about 90 dB is achieved, which exceeds the nominal dynamic range of the filter, typically 60–70 dB.

2. Description of Second Embodiment of Subject Invention

Figure 2:
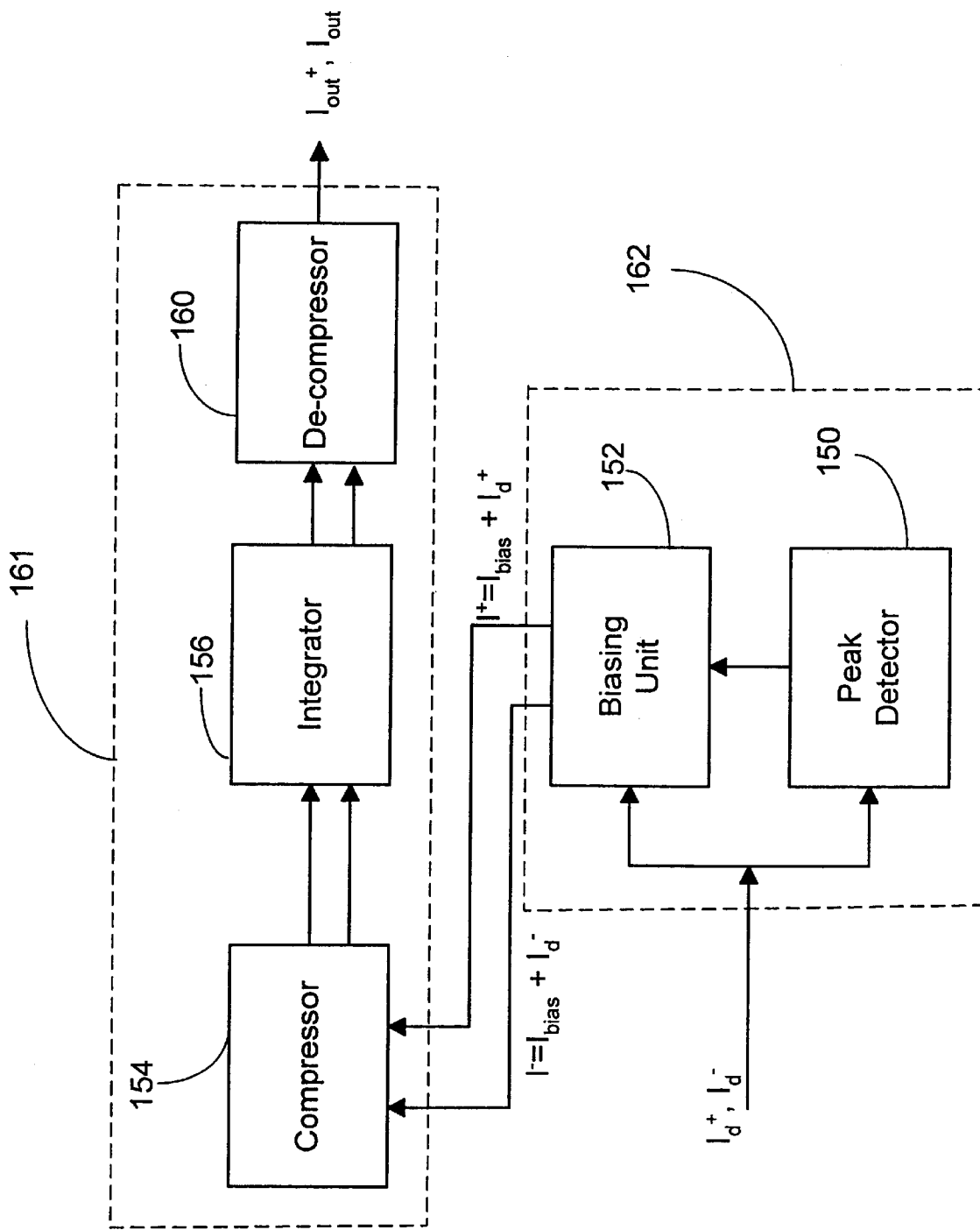
FIG. 2 illustrates a block diagram of a second embodiment of the subject invention.

FIG. 2 illustrates a block diagram of a filter system in accordance with a second embodiment of the subject invention. The second embodiment comprises a filter portion 161, and a filter control portion 162. The filter control portion 162 monitors a parameter of the incoming signal, and adjusts the filter portion 161 accordingly.

In one implementation, the filter control portion 162 comprises a peak detector 150 and a biasing unit 152, both of which receive current signals $I_d^+, I_d^-$, a differential mode representation of the received signal. Presently existing log-domain filters are current mode, which is advantageous since the compression point of current mode filters, unlike that of voltage mode filters, is not limited by the power supply voltage. However, it should be appreciated that a voltage mode log domain filter is also within the scope of the subject invention. Differential mode representations of signals are known to those of skill in the art. See, e.g., P. Gray & R. Meyer, "Analysis and Design of Analog Integrated Circuits," Third Ed., pp. 230–244, which is hereby fully incorporated by reference herein as though set forth in full. Use of a differential mode representation of a signal provides the benefit of reduced EMF generation due to cancellation, reduced coupling, and an ability perform noise cancellation.

The peak detector 150 monitors the peak magnitude of the received signal and communicates that value to the biasing unit 152. The peak detector 150 may comprises a basic diode-capacitor network, active element peak detection circuitry or a software arrangement. Peak detection may be performed in either the analog or digital domain.

The biasing unit 152 receives the detected peak magnitude from the peak detector 150, and, responsive thereto, adjusts the bias level $I_{bias}$ accordingly. In one implementation example, the bias level is chosen to avoid zero crossings for the signals $I^+$ and $I^-$. Zero crossings are undesirable because they cause the overall filter system to enter a non-linear region of operation in which clipping or the like may occur as a defined compression point, such as the 1 dB compression point, is encountered.

In one implementation, any pre-existing common mode in the differential signals $I_d^+$, $I_d^-$ is removed by the biasing unit 152, and then replaced with Ibias. The resulting differential signals, $I^+$, $I^-$, are provided to the compressor 154.

The filter portion 161 in this implementation comprises a compressor 154, one or more integrator 156, and decompressor 160. The compressor 154 receives a differential mode representation of the received signal biased in accordance with a bias level $I_{bias}$ determined by the biasing unit 152. The differential mode representation of the received signal comprises two current signals, $I^+$, $I^-$, wherein $I^+=I_d^+ + I_{bias}$, and $I^-=I_d^- + I_{bias}$. The compressor 154 receives these signals, compresses them, and provides output signals. In one implementation example, the compressor is a log-domain compressor such that the output signals are derived from the natural logarithm of a corresponding one of the input signals.

The integrator 156 integrates the outputs signals from the compressor in the log domain, and decompressor 160 expands each of these signals to provide differential output signals $I_{out}^+$, $I_{out}^-$. In one implementation example, applicable in the case in which compressor 154 is a log-domain compressor, decompressor 160 exponentially expands each the signals received from the integrator.

Figure 3:
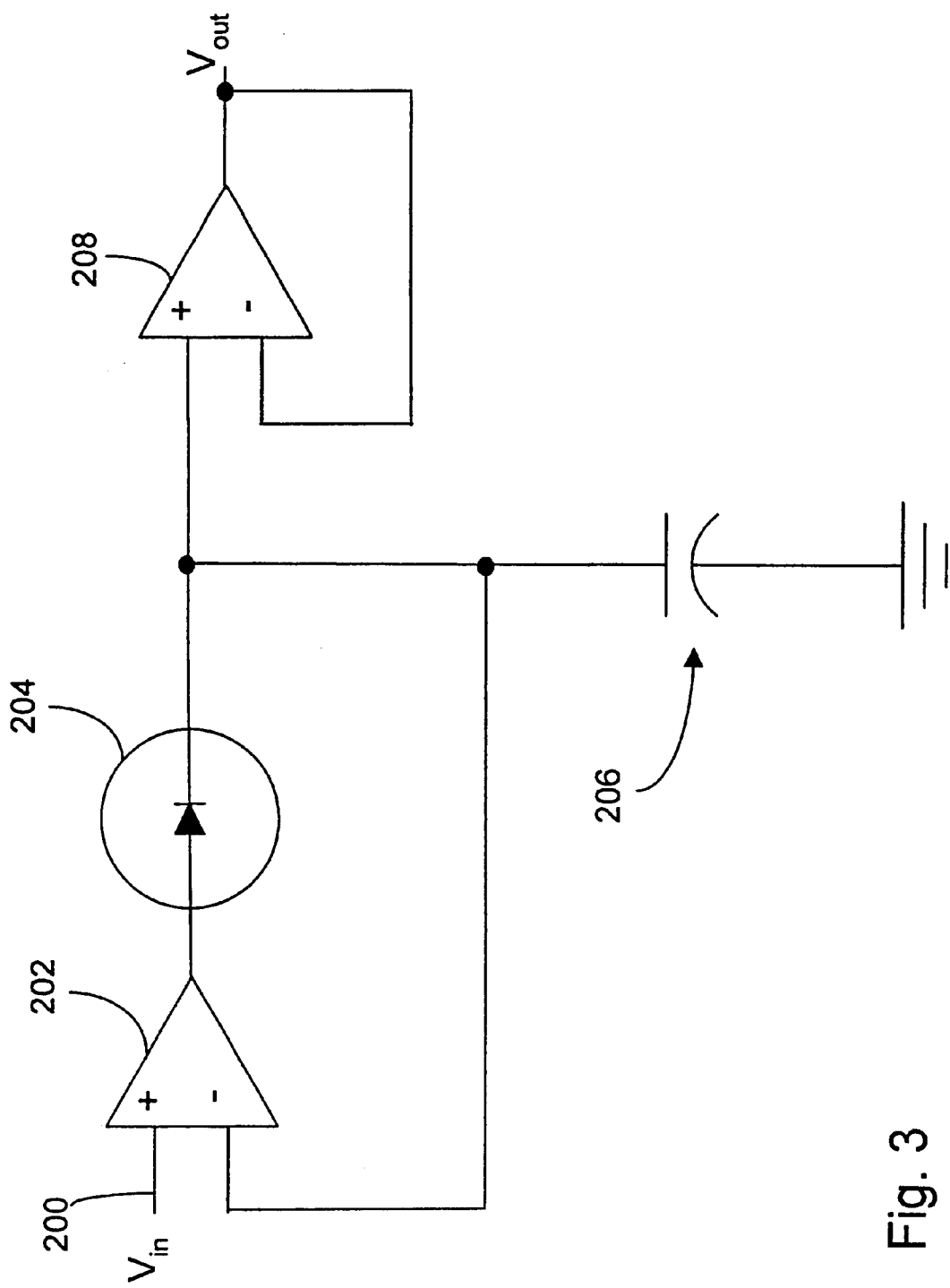
FIG. 3 illustrates a first embodiment of a peak detector as contemplated for use in the subject invention.

FIG. 3 illustrates a block diagram of one embodiment of peak detector 150. A voltage input 200 derived from either of the differential mode input currents $I_d^+$, $I_d^-$, is provided to a positive input of a first operational amplifier 202 (op-amp). The output of the first op-amp connects to an input of diode 204. The output of the diode 204 connects to a positive input of a second op-amp 208. This signal line is also connected, in a feedback loop arrangement, to the negative input of the first op-amp. 202, and to a storage capacitor 206. The opposite side of the storage capacitor 206 is grounded.

The second op-amp 208 receives as its positive input the output of the diode 204. The output of the second op-amp 208 is fed back to the negative input thereof. The output of the second op-amp 208 is the voltage $V_{out}$.

This circuit utilizes the capacitor voltage as feedback to the first op-amp 202 to counteract the drop in diode voltage. In preferred configurations, the op-amps 202, 208 utilize with very low bias current. The first and second op-amps 202, 208 should present high input impedance, similar to that presented by a FET op-amp.

The circuit operates as follows. The diode 204 conducts when the input voltage $V_{in}$ is greater than the sum of the drop across the diode $V_d$ and the capacitor voltage $V_c$. As the diode conducts, the capacitor will store charge at a rate determined by the current flow through the diode. Eventually, the capacitor voltage will equal the peak voltage $V_p$ of the input $V_{in}$. When the input voltage $V_{in}$ drops below the peak voltage, the diode will not conduct. The capacitor will thus preserve $V_p$. The second op amp 208 outputs the voltage $V_p$ at its output port, while providing a high impedance buffer for that output.

Preferably, the first embodiment of peak detector 150 includes a reset mechanism, such as a resistor coupled across the capacitor such that the charge on the capacitor decays at a rate determined by the time constant RC. In this embodiment, the capacitor holds only the most recent peak, and will slowly decrease in voltage until a peak of greater voltage than that on the capacitor appears. Yet another reset method is to connect a transistor switch across the capacitor 206 such that a short pulse to the base of the transistor discharges the capacitor.

Figure 11:
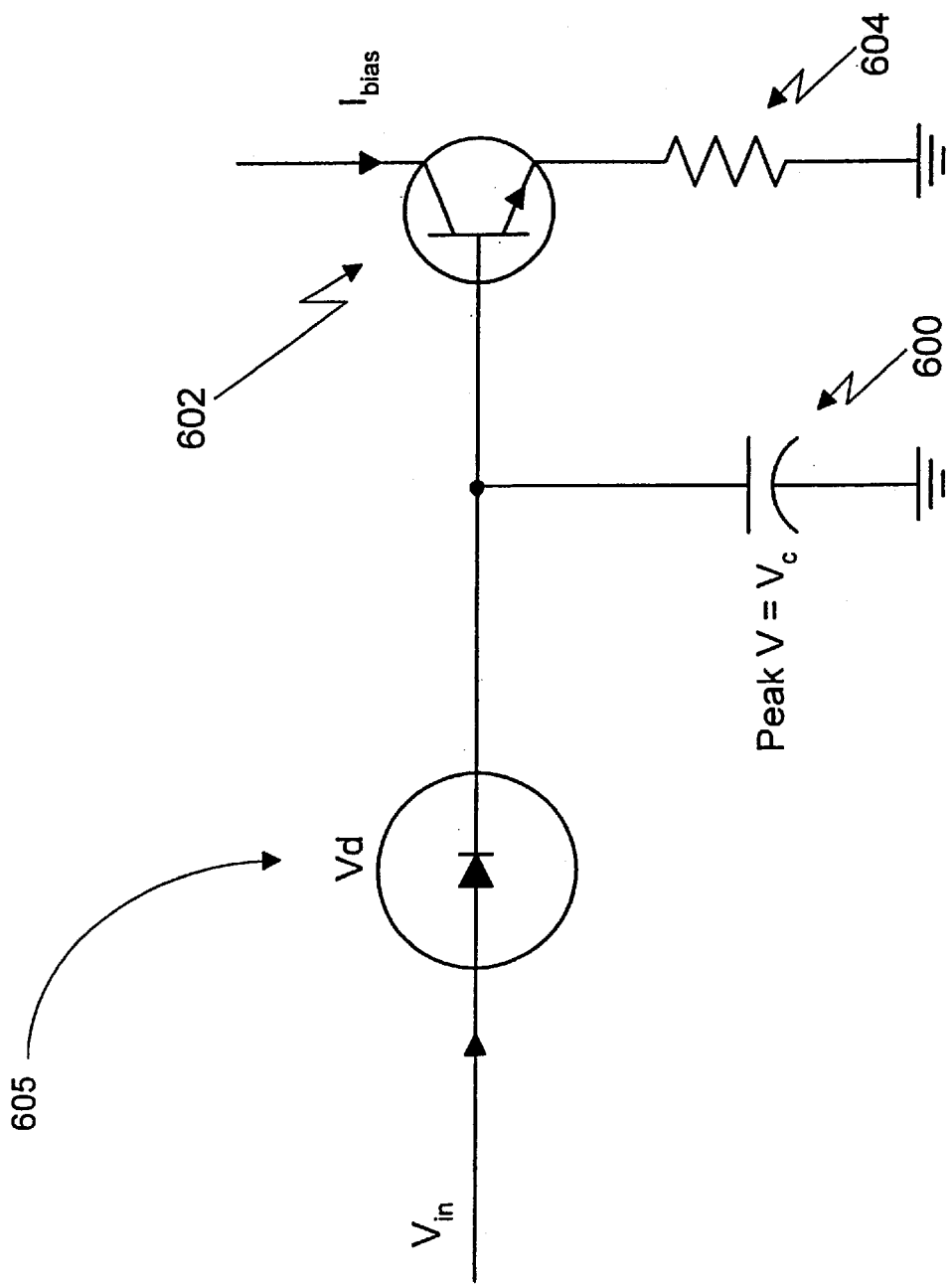
FIG. 11 illustrates a second embodiment of a peak detector in accordance with the subject invention.

FIG. 11 illustrates a second embodiment of peak detector 150. In this embodiment, when the input voltage $V_{in}$ exceeds the sum of $V_d$, the voltage drop across diode 605, and $V_c$, the voltage of the capacitor 600, the diode conducts, and the current that flows there through charges the capacitor 600. The voltage $V_c$ will thus represents the peak voltage. Moreover, when the input voltage $V_{in}$ falls below its peak value, the capacitor will retain the peak voltage $V_p$.

The transistor 602 and resistor 604 form a transconductance or gmC stage. The transistor 602 has its emitter connected to ground via resistor 604. The transistor 602 converts the peak voltage $V_p$ detected across capacitor 600 to an output current $I_{bias}$ This signal represents the bias added to the differential mode signal by biasing unit 152.

Figure 4:
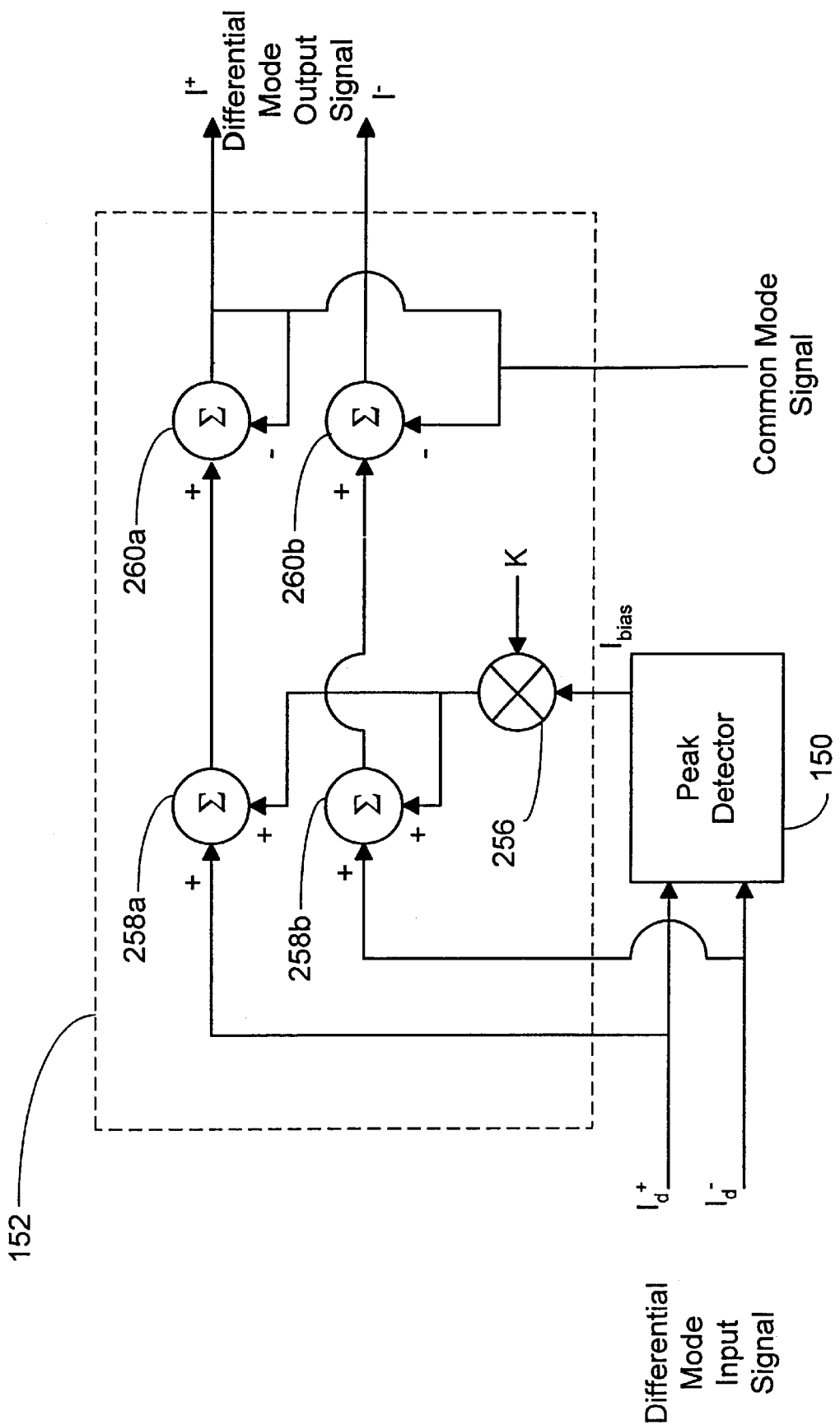
FIG. 4 illustrates an embodiment of a biasing unit as contemplated for use in the subject invention.

FIG. 4 illustrates an example implementation of biasing unit 152. The inputs to this implementation are the differential inputs $I_d^+$ and $I_d^-$, $I_{bias}$, the output of the peak detector 150, and a common mode signal representative of any pre-existing common mode component present in the differential mode signals $I_d^+$ and $I_d^-$. It should be appreciated by those of skill in the art that this pre-existing common mode signal is equal to $(I_d^+ + I_d^-)/2$. The output of peak detector 150, $I_{bias}$, is representative of the peak of the differential mode input signals $I_d^+$, $I_d^-$. The function of the biasing unit 250 is to replace any such pre-existing common mode component with a value derived from $I_{bias}$.

As illustrated, biasing unit 152 in this implementation comprises summing junctions 258a, 258b, and difference junctions 260a, and 260b. In addition, a multiplier 256 is provided. The multiplier functions to multiply $I_{bias}$ by a constant K. The output of the multiplier 256, $K \times I_{bias}$, is provided as an input to a pair of summing junctions, 258a and 258b. Summing junction 258a adds $K \times I_{bias}$ to the input current $I_d^+$, while summing junction 258b adds $K \times I_{bias}$ to the input current $I_d^-$. The outputs of the summing junction pair 258a, 258b connect to a difference junction pair 260a, 260b. More specifically, the output of summing junction 258a is coupled to the input of difference junction 260a, and the output of summing junction 258b is coupled to the input of difference junction 260b.

The difference junction pair 260a, 260b subtracts the common mode signal from each of the signals output from the first summing junction pair 258a, 258b. More specifically, difference junction 260a subtracts the common mode signal from the signal output from summing junction 258a, while difference junction 260b subtracts the common mode signal from the signal output from summing junction 258b. The output of difference junction 260a is I⁺, and the output of difference junction 260b is I⁻. As can be seen, these signals are derived by replacing any pre-existing common mode component of the input signals $I_d^+$, $I_d^-$, with $K \times I_{bias}$.

FIG. 12 illustrates an embodiment of compressor 154. As shown, a bias voltage $V_b$ is presented to the base of a transistor 610. The collector of the transistor 610 connects to the gate of a FET 611. The emitter of transistor 610 also connects to the source of the FET 611. An output voltage $V_1$ is provided at the emitter of the transistor 610. An input current $I_{in}$ is provided at the collector of transistor 610. The output voltage $V_1$ bears the following relationship with the input current $I_{in}$: $V_1 = K_1 + V_b - (K_2 \times I_{in})$, where $K_1$ and $K_2$ are constants, or substantially constant, over the operating region of interest. This relationship can be derived from the following relationship which holds between the base-emitter voltage, $V_{be}$, and the collector-emitter current, $I_{ce}$, in a bipolar transistor:

$$I_{ce} = I_s e^{\frac{V_{be}}{V_T}},$$

where $V_T = kT/q$, and $I_s$ is the saturation current. Thus, this circuit functions to provide an output voltage $V_1$ which is proportional to the natural logarithm of the input current $I_{in}$.

FIG. 13 illustrates an embodiment of decompressor 160. As shown, a transistor 620 receives an input voltage signal $V_o$ at its emitter, and provides an output current signal $I_o$ at its collector. A bias voltage $V_b$ is provided to the base of the transistor. The output current signal $I_o$ bears the following relationship to the input voltage signal $V_o$:

$$I_o = I_s e^{\frac{(V_b - V_o)}{V_T}},$$

where $I_s$ and $V_T$ have the previously-defined meanings. Thus, it can be seen that the output current signal is derived by exponentially-expanding the input voltage signal.

Figure 6:
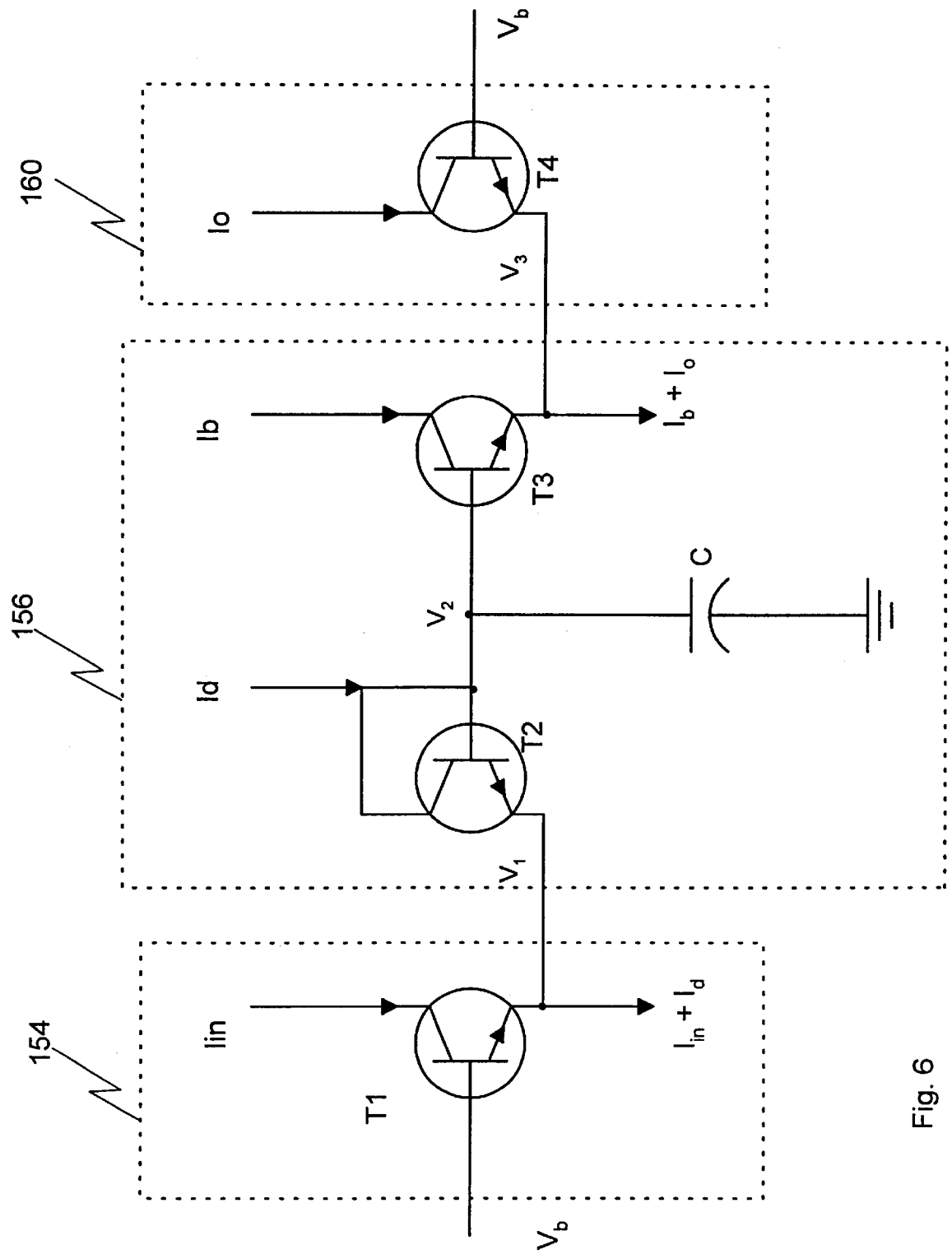
FIG. 6 illustrates an embodiment of a log-domain filter for use in conjunction with the subject invention comprising a compressor, an integrator, and a decompressor coupled together in a cascade arrangement.

FIG. 6 illustrates an implementation of filter portion 161 in which integrator 156 is interposed between compressor 154 and decompressor 160. The input to the compressor is $I_{in}$, and the output is voltage $V_1$. The voltage $V_1$ is provided as an input to the integrator 156, and the output of the integrator is voltage signal $V_3$. The voltage $V_3$ is input to the decompressor 160, and the output of the decompressor is current $I_0$.

Assuming differential mode inputs and outputs, the embodiment illustrated in FIG. 6 illustrates only one-half of the circuit that would be implemented in practice, with the other half being the mirror image of the circuit shown in FIG. 6. Thus, $I_{in}$ can represent either $I_{in}^+$ or $I_{in}^-$, and $I_o$ can represent either $I_o^+$ or $I_o^-$. Assuming $I_{in}$ represents $I_{in}^+$ then $I_o$ represents $I_o^+$, and a mirror image of the circuit of FIG. 6 would be provided for $I_{in}^-$ and $I_o^-$. Assuming $I_{in}$ represents $I_{in}^-$, then $I_o$ represents $I_o^-$, and a mirror image of the circuit of FIG. 6 would be provided for $I_{in}^+$ and $I_o^-$.

The output of the compression stage 154, voltage $V_1$, is provided to the integrator 156 The integrator 156 comprises transistors T2 and T3 and a capacitor C connected to ground. The emitter of transistor T2 is coupled to the emitter of T1, and the voltage $V_1$ is thus provided to the emitter of T2. The base of T2 is coupled to the collector thereof. A damping current $I_d$ is provided to the collector of T2. The base of T2 is connected to that of T3 and to the non-grounded node of C. The voltage at this node is designated $V_2$. A bias current $I_b$ is provided to the collector of T3. The emitter of T3 is coupled to that of T4. The voltage at this node is designated $V_3$. The output current $I_o$ is provided at the collector of T4. A bias voltage $V_b$ is provided to the bases of T1 and T4. A current equal to the sum of $I_{in}$ and $I_d$ is provided on the emitter of T2. A current equal to the sum of $I_b$ and $I_o$ is provided on the emitter of T4.

In the circuit of FIG. 6, it can be shown that the following relationship holds:

$$\frac{dI_o^d}{dt} = \frac{I_{in}^d I_b}{V_T C} - I_o^d \times \frac{I_d}{V_T C}$$

where $I_o^d = I_o^+ - I_o^-$ and $I_{in}^d = I_{in}^+ - I_{in}^-$. Thus, the transfer function for this circuit is:

$$\frac{I_o^d}{I_i^d} = \frac{I_b}{V_T C s + I_d}$$

As will be appreciated by those of skill in the art, this is the transfer function of a low-pass filter (LPF). It has a single tunable pole at $$s = -\frac{I_d}{V_T C},$$

that is, the location of the pole can be moved through suitable changes in the parameters $I_d$ and C. If $I_d$ were zero, then the resulting transfer function, $$\frac{I_b}{V_T C s},$$

is that of an integrator. Thus, it can be seen that the function of filter portion 161, whether as an integrator or LPF, is controlled by $I_d$. In both cases, the gain of the integrator/LPF is set by $I_b$. This is important for tuning the complex poles of higher order filters, the location of which is set by $I_b$.

It should also be appreciated that numerous hardware and software implementations are possible, and that the foregoing examples are shown for purposes of understanding and discussion and are not intended to limit the scope of the subject invention.

Figure 5:
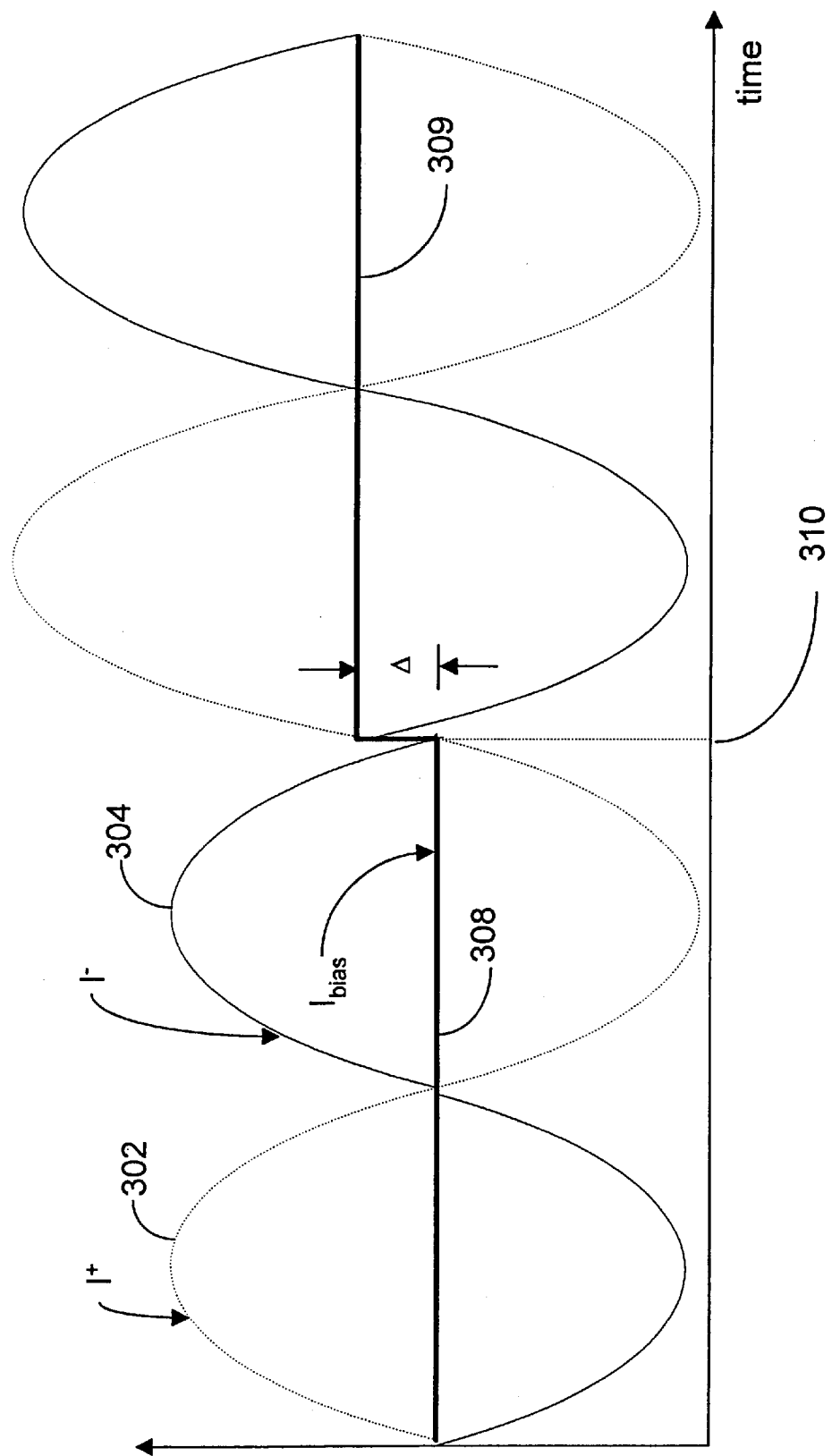
FIG. 5 illustrates dynamically adjusting the common mode component of a differential mode input signal in accordance with one embodiment of the subject invention.

FIG. 5 is plot verses time of the differential mode signals I⁺, I⁻, identified respectively in the figure with numerals 302, 304, and the biasing signal $I_{bias}$, identified with numerals 308, 309, which forms the common mode of I⁺, I⁻. This figures illustrates the process of dynamically adjusting the biasing signal and the dynamic range window of the filter system in accordance with the subject invention as the amplitude of the received signal changes. Thus, prior to time 310, when the amplitude of the received signal is at a certain level, the biasing signal $I_{bias}$ is at a level 308. As can be seen, $I_{bias}$ is set to avoid zero crossings by either of the signals 302, 304.

However, after time 310, during which the amplitude of the signals I⁺, I⁻ has increased by Δ, the biasing level of $I_{bias}$ is automatically increased to level 309. As can be seen, the biasing level is also increased by Δ so that zero crossings of the differential mode signals I⁺ and I⁻ is avoided. This way, the compression point, which defines the onset of non-linear behavior of the filter system, is automatically increased since the signal has to swing a greater amount before it encounters a zero crossing. The result is a dynamic adjustment to the dynamic range window of the filter system from the previous time period.

Figure 8:
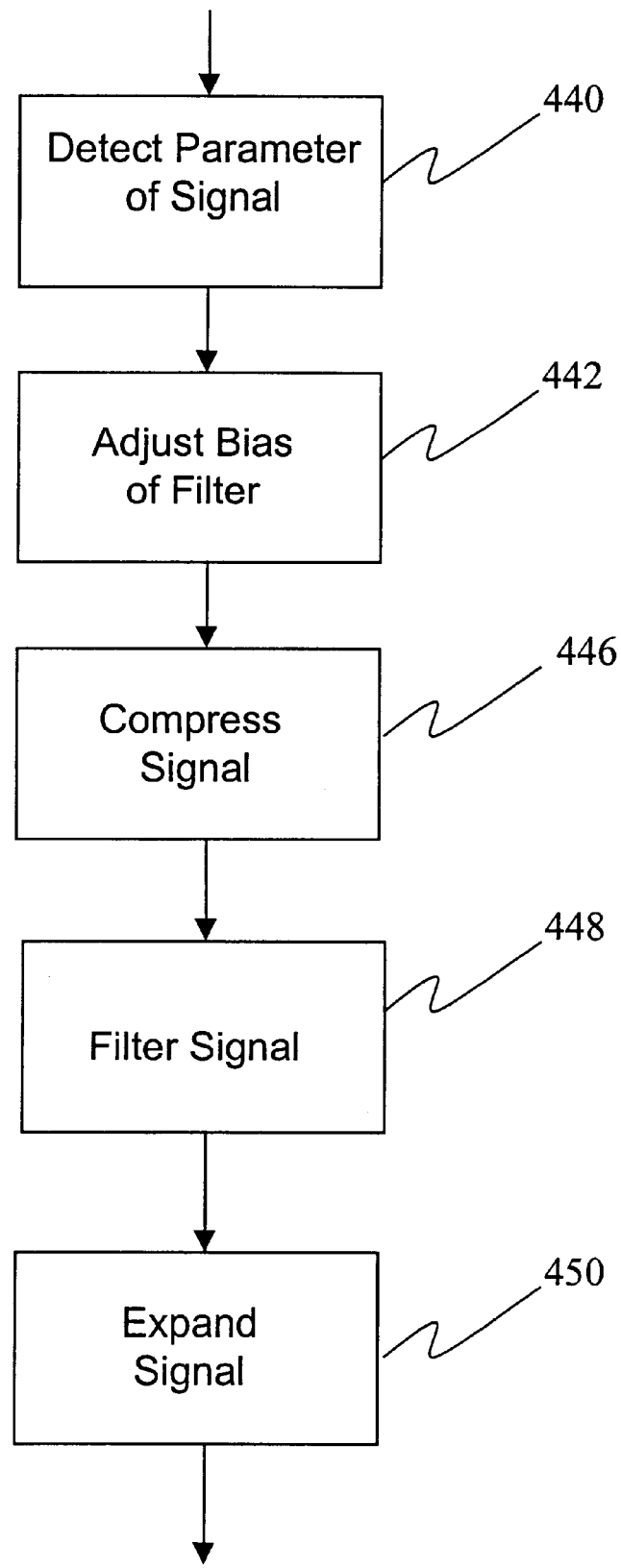
FIG. 8 illustrates an operational flow diagram of a method of operation of the subject invention.

FIG. 8 illustrates an embodiment of a method of operation of the subject invention. At a step 440, the operation detects a parameter of a received signal. In one implementation of the method, the parameter is a peak amplitude detected by peak detector 150.

At a step 442, the bias level of a filter is determined responsive to the parameter detected in step 440. In one implementation of this method, the biasing unit 152 performs this function. In this implementation, the bias level is dynamically adjusted to avoid zero crossings of the resulting signal. In one implementation example, the filter is a log-domain filter.

Next, at a step 446, the received signal is compressed. In one implementation, the received signal is compressed by determining the logarithm of the signal. In one implementation example, the logarithm chosen is the natural logarithm.

At a step 448, the compressed signal is filtered in accordance with a desired transfer function. In one implementation, the filter is an active filter. In another implementation, the filter is a log-domain filter.

Next, at a step 450, the filtered, compressed signal is expanded. In one implementation, the signal is expanded through an exponential function. In one implementation example, the base of the exponential function is the constant e.

The foregoing embodiments, implementation, and implementation examples achieve significant power savings in relation to systems of the prior art by reducing the amount of power consumed when the received signal is of low power. In this case, the parameter detector detects the low power level of the received signal and directs the biasing unit to reduce the bias current of the filter accordingly. This results in a power savings over prior art filters which maintain high bias current levels at all times to provide adequate head room to process high power signals. The power savings of the subject invention do not degrade the quality, precision, linearity, or dynamic range of the filter system.

The subject invention also provides the advantage of increasing the effective dynamic range of the filter. Active tunable filters with more than 60–70 dB of usable dynamic range, that is, dynamic range between the filter compression point (ceiling) and the noise floor, are difficult to design and operate. The noise floor of the filter is the minimum signal level below which the desired signal component can not be distinguished from the noise created by the active filter. Active filters inherently generate noise, which is discussed below in greater detail. By adjusting the bias level of the filter, the nominal dynamic range of 60–70 dB can be effectively increased to up to 90 or even 140 dB.

Yet another advantage of the subject invention is that adjustments to the dynamic range window are dynamic and linear, as are adjustments in pole locations. Pole locations and the dynamic range window are independent variables. In the implementation which has been described, pole locations are determined by $I_b/I_d$, while the dynamic range window is controlled by $I_{bias}$. Consequently, the sharp, non-linear, jumps or transitions characteristic of RCL switching filters or switchable active filter banks are avoided. Dynamic and linear adjustments to the dynamic range window improve filtering performance, reduce cost, and reduce space requirements.

Still another advantage of the subject invention is that the filter blocks thereof are tunable. Tunable filters provide the advantage of adjusting the corners of the frequency response based on input current, and to account for variations in capacitor and resistor values, which reduce the precision of non-tunable filters. Further, tunable filters are able to accommodate the variance in operating frequency in different communication standards. For example, tunable filters allow for in increase in the pass band to accommodate the different range of frequency allocation between GSM and CDMA mobile phone systems.

An additional advantage is that the active filter network of the subject invention consumes less chip area than prior art passive RCL filters.

Figure 10:
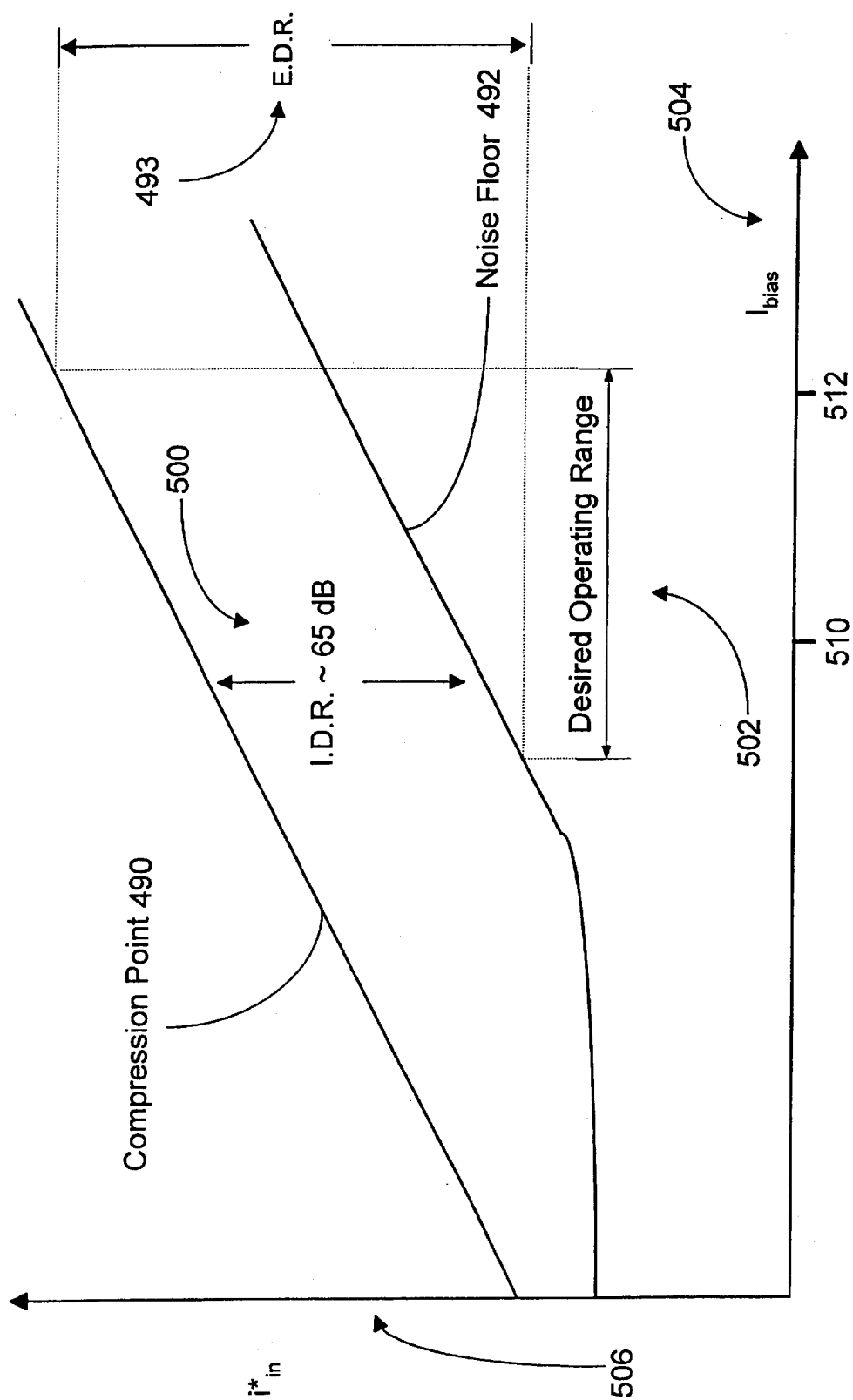
FIG. 10 illustrates the relationship between the dynamic range, bias level, and input inferred noise in one embodiment of the subject invention.

Finally, the subject invention possesses the advantage of reducing the level of noise generated by the filter. FIG. 10 illustrates the dynamic range of a filter system in accordance with the subject invention plotted as a function of $I_{bias}$ and $I^*_{in}$, input inferred noise. Input inferred noise is a common reference with which to characterize the noise generation properties of an electrical system. The horizontal axis 504 represents $I_{bias}$ while the vertical axis 506 represents $I_{in}^*$. As illustrated, the instantaneous dynamic range represents the range between the noise floor 492 and the compression point 490. The noise floor 492, which is the level of noise generated by the active filter components for a particular $I_{bias}$ input, generally increases with the level of $I_{bias}$ as does $I_{in}^*$. As can be seen, the effective dynamic range which is achieved, identified by numeral 493, exceeds the instantaneous dynamic range.

An aspect of the subject invention is dynamic adjustments to $I_{bias}$ based on a parameter of the received signal. Unlike prior art systems, the bias current is not fixed at a high level to accommodate large amplitude signals. Since $I_{bias}$ is dynamically adjusted responsive to the input signals, the noise generated by the filter system of the subject invention is reduced when $I_{bias}$ is lowered. Consequently, in relation to the prior art, the generated noise is reduced during periods in which the received signal is below its peak value. For example, the level of noise generated at $I_{bias}$ level 510 is less than the noise level generated at $I_{bias}$ level 512.

With reference to FIG. 6, an analysis will now be undertaken to demonstrate that the noise floor rises with an increase in $I_{bias}$. For noise in a generalized log-domain filter (esp. in-band and shot-noise), in-band, it can be shown that:

$$I_0 = \frac{I_{in} \times I_b}{I_d}$$

To find the effect of a perturbation (i.e., noise) in one of the currents on the output, the following relationship is used:

$$i_0^* = \frac{d i_0}{d i_x} \times i_x^*$$

This leads to:

$$i_{out}^* = i_o^* + \left(i_b^* \times \frac{I_{in}}{I_d}\right) + \left(i_d^* \times \frac{I_{in} \times I_b}{I_d^2}\right) + \left(i_{in}^* \times \frac{I_b}{I_d}\right)$$

Referring this to the input gives input inferred noise:

$$i_{input}^* = i_{in}^* + \left(i_d^* \times \frac{I_{in}}{I_d}\right) + \left(i_b^* \times \frac{I_{in}}{I_b}\right) + \left(i_0^* \times \frac{I_d}{I_b}\right)$$

Assuming the primary noise mechanism is collector shot noise, it can be shown that:

$$\vec{i}_{input} = \sqrt{2q\Delta f} \times \left(I_{in} + \frac{I_{in}^2}{I_d} + \frac{I_{in}^2}{I_b} + I_{in} \times \frac{I_d}{I_b}\right)^{\frac{1}{2}}$$

This equation provides proof that the noise floor rises and falls with $I_{bias}$ since all the terms within parentheses depend from $I_{in}$. Moreover, when the $I_{in}$ value is large, the squared terms dominate and the relationship between noise floor and $I_{bias}$ can be approximated as linear. This mathematically shows the relationship of the noise floor to the input current. Thus, reducing $I_{bias}$ reduces the noise generated by the filter system.

3. Example Implementation

FIG. 14 illustrates an example implementation of a log-domain filter system in accordance with the subject invention. As shown, the system is symmetrical, and divided into two half portions 661 and 662 which are mirror images of one another. Portion 661 comprises a compressor stage 650, integrator stage 656, a biasing circuit 654, and de-compressor 656. Similar elements made up the second portion 662. Crossover 660 connects the two portions together. Crossover 660 is a common mode biasing configuration configured to provide the proper biasing of the filter network during periods when the $I_{damp}$ signal is small as compared to the input signal.

Figure 9:
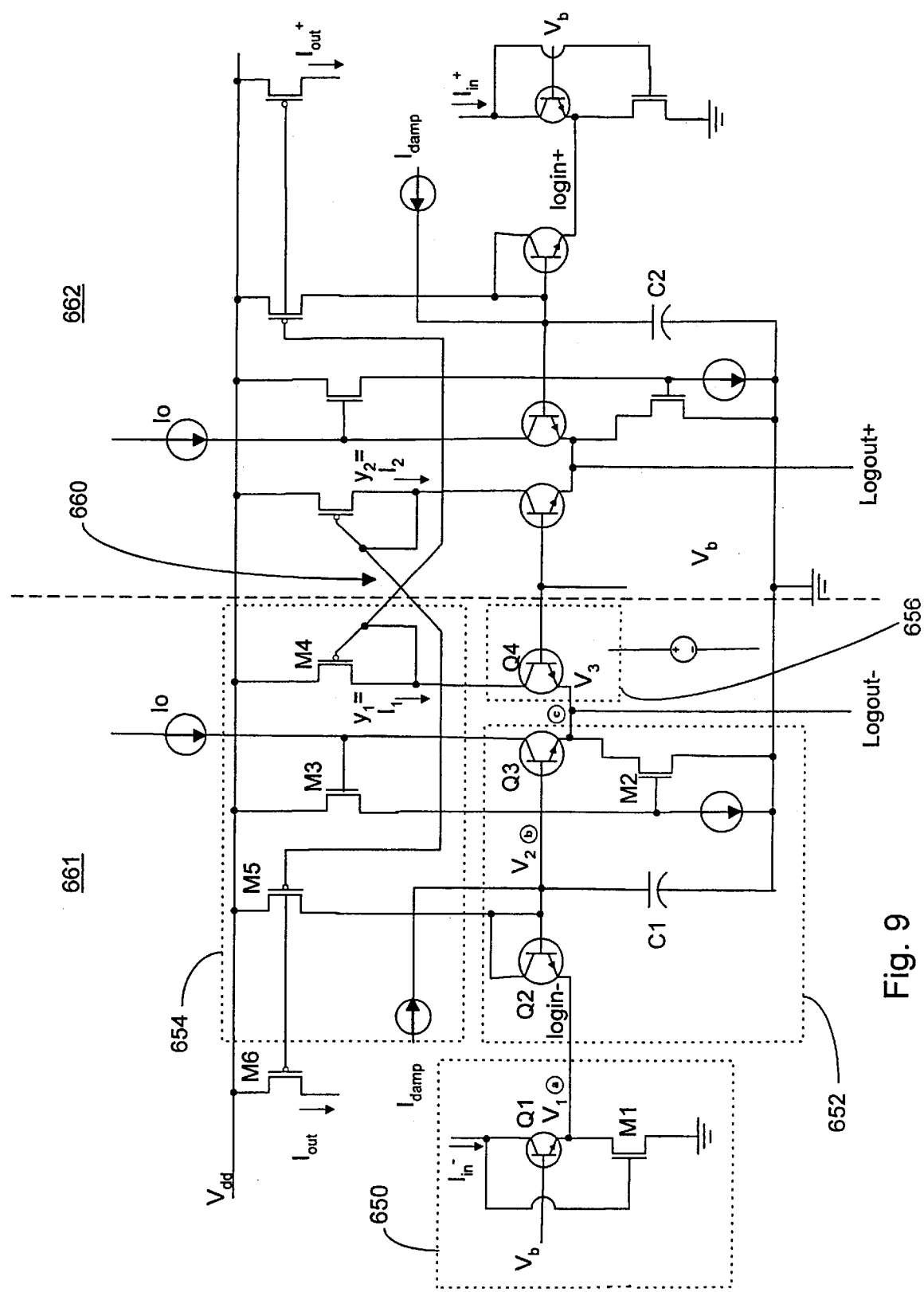
FIG. 9 illustrates an example implementation of the filter block of FIG. 6.

The inputs to the system are the differential mode signals $I_{in}^-$ and $I_{in}^+$, with the signal $I_{in}^-$ being input to the compressor 650 in the left half portion 661 of the system, and the signal $I_{in}^+$ being input to the compressor in the right half portion 662 of the system. The common mode component of these signals has been previously set to a suitable level of $I_{bias}$ by a peak detector in combination with a biasing unit configured in accordance with the subject invention (neither of which are shown in FIG. 9).

Because of the symmetry of the system, its operation can be wholly explained with reference to the leftmost portion 661. The input current $I_{in}^-$ is compressed by the compressor 650 formed of Q1 and M1, the operation of which has been previously explained in relation to FIG. 12. As previously described, the output voltage thereof, $V_1$, bears the following relationship to $I_{in}^-$: $V_1=K_1+V_{b-}(K_2 \times 1n\ I_{in}^-)$ where $K_1$ and $K_2$ are constants, and $V_b$ is the bias voltage to Q1.

The signal $V_1$ is then input to the integrator 656 comprising Q2, Q3, M2, and $C_1$, the operation of which has previously been described in relation to FIG. 6. The output of the integrator 656, voltage signal $V_3$ is then input to the decompressor 656, the operation of which has been previously described in relation to FIG. 13. The output of the decompressor 656 is the current signal $I_1$ or $y_1$. Letting $y^d$ be the differential output signal $Y_2-Y_1$, and $I_{in}^d$ be the differential input signal $I_{in}^+-I_{in}^-$, as previously described, the transfer function between $y^d$ and $I_{in}^d$ is as follows:

$$\frac{y_d}{I_{in}^d} = \frac{I_o}{V_T C_1 s + I_{damp}}$$

Again, this is the transfer function of a low-pass filter with a tunable pole at $$s = \frac{-I_{damp}}{V_T C_1},$$

the location of which can be set by varying $C_1$ and $I_{damp}$. The gain is also variable, and can be set by varying $I_o$.

Decompressor 656 comprises Q4. As previously described in relation to FIG. 13, the output of the decompressor, $I_1=y_1$, bears the following relationship to the input $V_3$:

$$I_1 = I_s e^{\frac{(V_b-V_3)}{V_T}}.$$

Biasing stage 654 comprises M5, M3, M4, the current source $I_{damp}$, and the current source $I_o$. Q3 in combination with M3 provides a level shift on $V_2$ dependent on $I_o$. M4 in combination with M6 mirror $I_1$, the output from Q4, to provide $I_{out}^-$. M3 provides a level shift to keep Q3 out of saturation.

The outputs Logout− and Logout+ represent the compressed output from the core filter stages and are provided in case it is desired to cascade the filter block of FIG. 9 output to similar filter block. These outputs obviate the need to decompress and then re-compress if such a cascaded configuration is desired.

The derivation of the transfer function for the log-domain compressor, integrator, and decompressor illustrated in FIG. 9 will now be provided. The voltages at nodes a, b, and c, $V_1$, $V_2$, and $V_3$, respectively, are as follows:

a: $\quad V_1 = V_b - \left(V_T \times \ln\frac{I_{in}^-}{I_s}\right)$ b: $\quad V_2 = V_{C1};\ C_1\frac{dV_{C1}}{dt} = -I_s e^{(V_{C1}-V_1)/V_T} + I_2 + I_{damp}$ c: $\quad V_3 = V_{C1} - V_T \ln\frac{I_o}{I_s}$ From these equations, it follows:

$I_1 = I_s e^{(V_b-V_3)/V_T}$;

$I_1 = I_o e^{(V_b-V_{C1})/V_T}$;

and $I_2 = I_o e^{(V_b-V_{C2})/V_T}$;

Therefore, $$C_1 \frac{dV_{C1}}{dt} = -I_{in}^- - e^{(V_{C1}-V_b)/V_T} + I_o e^{(V_b-V_{C2})/V_T} + I_{damp};\ \text{and}$$

$$C_2 \frac{dV_{C2}}{dt} = -I_{in}^- + e^{(V_{C2}-V_b)/V_T} + I_o e^{(V_b-V_{C1})/V_T} + I_{damp}$$

However, the outputs $y_1$ and $y_2$ respectively equal $I_1$ and $I_2$, so substituting them in, and noting that $$\frac{dV_{C1}}{dt} = -\frac{V_T}{Y_i}\frac{dy_1}{dt},$$

and assuming $C_1 = C_2$, results in:

$$\frac{-V_T C}{y_1}\frac{dy_1}{dt} = -\frac{(I_{in}^+)I_0}{y_1} + y_2 + I_{damp}$$

$$\frac{-V_T C}{y_2}\frac{dy_2}{dt} = -\frac{(I_{in}^+)I_0}{y_2} + y_1 + I_{damp}$$

$$\frac{dy_1}{dt} = -\frac{(I_{in}^-)I_0}{V_T C} + \frac{y_1 y_2}{-V_T C} - \frac{I_{damp} y_2}{V_T C}$$

$$\frac{dy_2}{dt} = -\frac{(I_{in}^+)I_0}{V_T C} + \frac{y_1 y_2}{-V_T C} - \frac{I_{damp} y_2}{V_T C}$$

Taking the difference between the latter two equations results in:

$$\frac{dy_d}{dt} = -\frac{I_{in}^d I_0}{V_T C} - y_d \frac{I_{damp}}{V_T C}$$

where $I_{in}^d$ is $I_{in}^-$, and $y_d = y_2 - y_1$.

The foregoing is a transfer function for a low-pass filter, or, when $I_{damp}=0$, an integrator. Thus, the transfer function is as follows:

$$\frac{y_d}{I_{in}^d} = \frac{I_0}{V_T C s + I_{damp}}$$

where $y_d$ is the differential output, $I_{in}^d$ is the differential input current, $I_o$ is the gain, and $I_{damp}$ controls the tuning of the filter. Thus, this derivation shows that the transfer function of the filter block as a whole is that of a linear filter, even though the internal workings of the filter block, being in the log domain, are highly non-linear.

In one implementation of FIG. 9, M1 and M2 are ~1 μm. in gate length, and M5, M4, M6 are 0.35 μm. in gate length. In addition, Q1 and Q2 are ×10 the emitter area as Q2 and Q4.

Figure 7A:
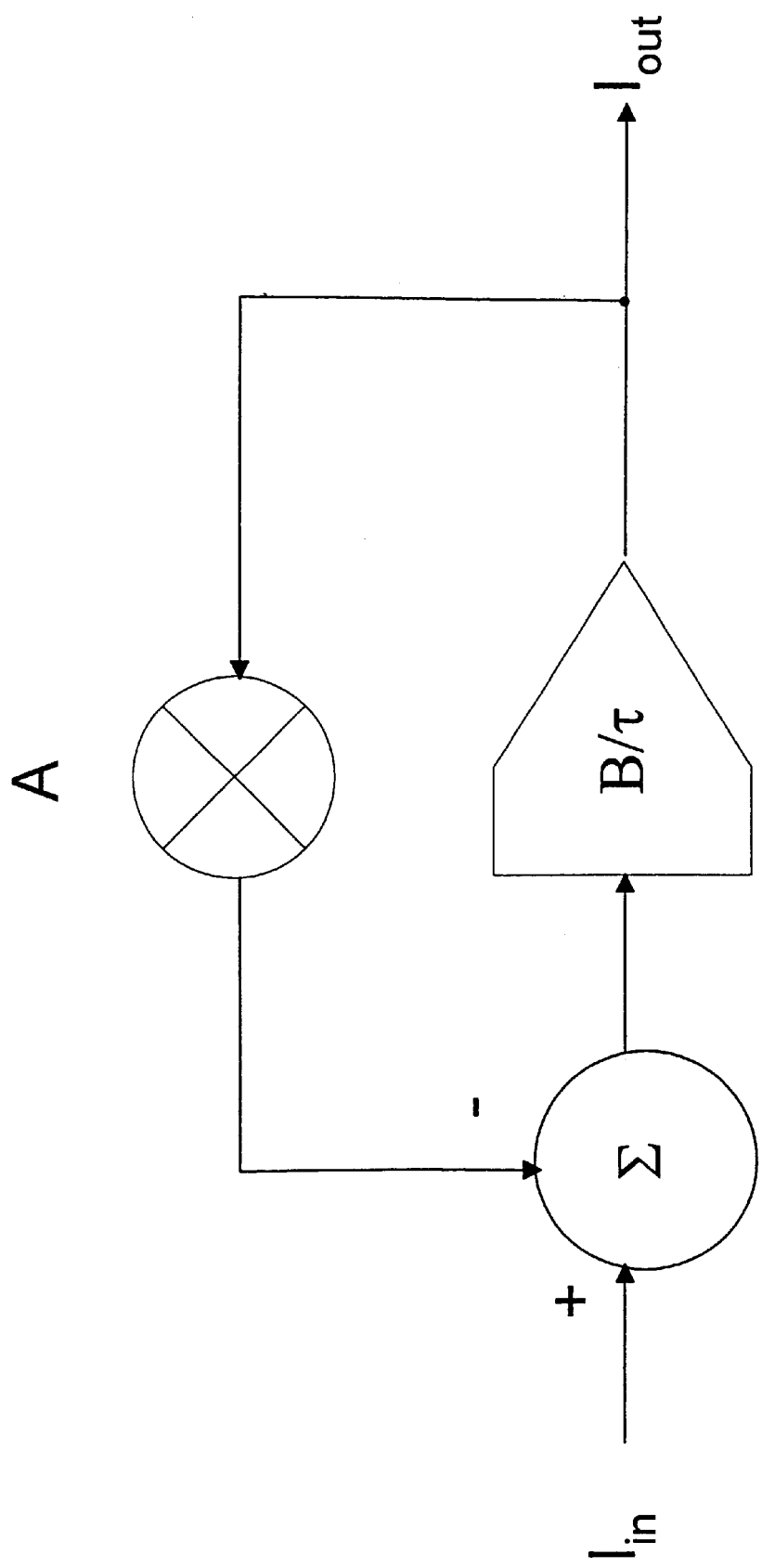
FIG. 7A illustrates a block diagram of a log domain filter in accordance with the subject invention.

FIG. 7A illustrates a block diagram representation of the filter block of FIG. 9. The transfer function of the system represented by FIG. 7A is as follows:

$$\frac{I_{out}}{I_{in}} = \frac{B}{A + s\tau}$$

It can be seen that through suitable values of A, B, and τ, the transfer function of the filter block of FIG. 9 can be obtained.

Through appropriate cascading of the filter block of FIG. 9, represented in block diagram form in FIG. 7A, a variety of other filter types can be implemented, including baseband, passband, low pass, bandpass, and high pass filters. It is expressly contemplated that the filter portion 161 in the embodiment of FIGS. 2 can be one or more of the filter blocks of FIGS. 7A and 9 configured in a cascade or other arrangement.

Figure 7B:
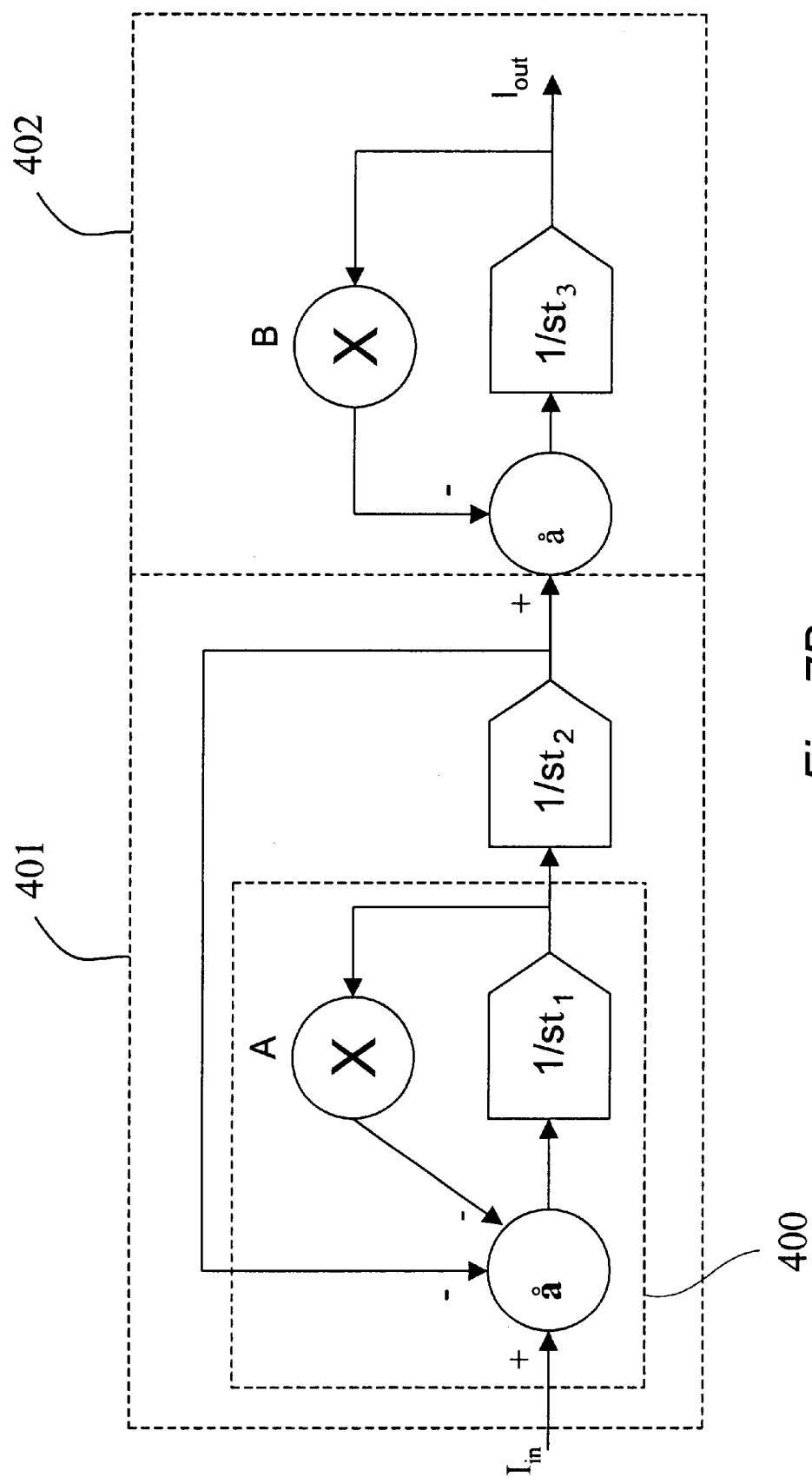
FIG. 7B illustrates a low pass filter obtained by placing three of the blocks of FIG. 7A in a particular configuration.

FIG. 7B is a block diagram of a base band filter implemented by placing three filter blocks 400, 401, 402 in a combined bi-quad and single pole structure. The transfer function for the cascaded system of FIG. 7B is as follows:

$$\frac{I_{in}}{I_{out}} = \frac{1}{\tau_1 \tau_2 \tau_3}\left(\frac{1}{\left(\frac{1}{\tau_1 \tau_2} + \frac{A}{\tau_1}s + s^2\right)\left(\frac{B}{\tau_3} + s\right)}\right)$$

To express this transfer function in terms of the parameters of the FIG. 9 implementation example, we first focus on block 402 in FIG. 7A. Relating the transfer function for this block alone with that for FIG. 9, we see:

$$\frac{1}{\tau_3}\left(\frac{1}{\frac{B}{\tau_3} + s}\right) = \frac{I_{o3}}{V_T C + I_{damp3}} = \frac{I_{o3}}{V_T C}\left(\frac{1}{\frac{I_{damp3}}{V_T C} + s}\right)$$

Therefore, it can be seen that $$\frac{V_T C}{I_{o3}} = \tau_3; \frac{I_{damp3}}{I_{o3}} = B$$

Extending this by analogy to blocks 400 and 401 in FIG. 7B, it can be seen that:

$$\frac{V_T C}{I_{o1}} = \tau_1; \frac{V_T C}{I_{o2}} = \tau_2; \frac{I_{damp1}}{I_{o1}} = A$$

In one implementation of FIG. 7B, $\tau_1=\tau_2=1.1$ μS; $\tau_3=0.8$ μS.;A=1.1; and B=0.5.

Figure 7C:
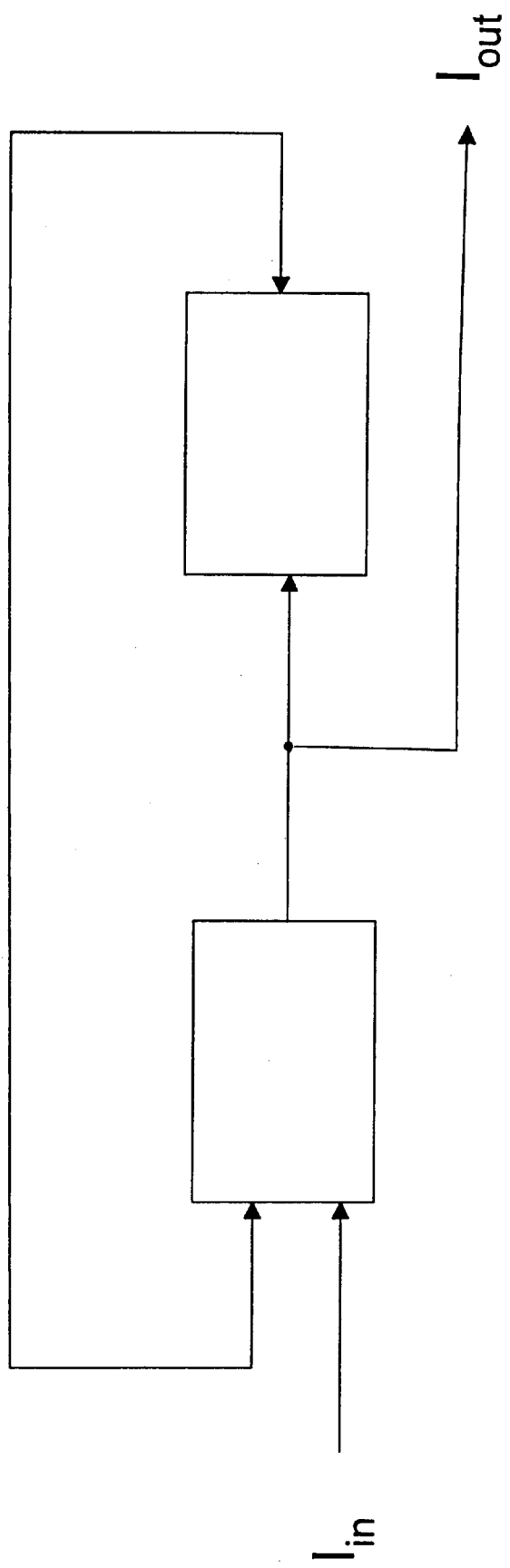
FIG. 7C illustrates a bandpass filter obtained by placing two of the blocks of FIG. 7A in a particular configuration.

As discussed, the blocks illustrated in FIG. 7A, and implemented in FIG. 9, can be cascaded to implement a variety of filter types. FIG. 7C illustrates two of the blocks of FIG. 7A in an arrangement that provides a pass band or band pass filter transfer function. A similar arrangement will yield the transfer function of a high pass filter.

While particular embodiments, implementations, and implementation examples of the present invention have been described above, it should be understood that they have been presented by way of example only and not limitation. Those of skill in the art will readily appreciate that other various embodiments, implementations or configurations adopting the principles of the subject invention are possible. Therefore, the breadth and scope of the present invention is defined by the following claims and their equivalents, and is not limited by the particular embodiments, implementations, and examples described herein.

What is claimed is:

1. A filter system comprising:
   a detector configured to detect a peak of a signal;
   a filter for filtering a biased signal generated by a biasing unit, the filter having a variable dynamic range window and comprising a compressor, an integrator, and a decompressor coupled in a cascade configuration; and
   the biasing unit configured to bias the signal responsive to the detected peak, thereby varying the dynamic range window of the filter responsive to the detected peak.

2. A filter system comprising:
   a detector configured to detect a peak of a differential mode signal and to generate a detected peak;
   a biasing unit configured to bias the differential mode signal and to generate a biased differential mode signal,
   a filter for filtering the biased differential mode signal, the filter has a dynamic range window; and
   the biasing unit responds to the detected peak to avoid zero crossings of the differential mode signal and the biasing unit varies the dynamic range window of the filter responsive to the detected peak.

3. The filter system of claim 2 wherein the biasing unit is configured to bias the common mode component of the differential mode signal.

4. The filter system of claim 3 wherein the biasing unit is configured to determine a bias signal responsive to the detected parameter, and replace any common mode component of the differential mode signal with a value derived from the bias signal.

5. A filter system comprising:
   a detector configured to detect a peak of a signal;
   a log-domain filter for filtering a biased signal generated by a biasing unit, the filter having a variable dynamic range window; and
   the biasing unit configured to bias the signal responsive to the detected peak, thereby varying the dynamic range window of the filter responsive to the detected peak.

6. A method of filtering a signal comprising:
   detecting a peak of a differential mode signal;
   biasing the differential mode signal responsive to the detected peak;
   replacing any common mode component of the differential mode signal with a value derived from the biased differential mode signal;

varying a dynamic range window of a filter responsive to the detected peak; filtering in the log domain the biased differential mode signal.

7. The method of claim 6 wherein the signal is a differential mode signal, and the method further comprises biasing the common mode component of the differential mode signal.

8. The method of claim 6 further comprising biasing the signal to avoid zero crossings thereof.

9. The method of claim 8 further comprising replacing any common mode component of the differential mode signal with a value derived from a bias signal.

10. A filter system comprising:

a detector configured to detect a peak of a signal;

a filter for filtering a biased signal generated by a biasing unit, the filter having a variable dynamic range window, the filter comprising a plurality of filter blocks and including complex poles; and the biasing unit configured to bias the signal responsive to the detected peak, thereby varying the dynamic range window of the filter responsive to the detected peak.

11. A filter system comprising:

a detector configured to detect a peak of a signal;

a filter comprising a plurality of filter blocks and complex poles for filtering a biased signal generated by a biasing unit, the filter having a variable dynamic range window; and the biasing unit configured to bias the signal responsive to the detected peak, thereby varying the dynamic range window of the filter responsive to the detected peak.

12. The system of claim 11 wherein the plurality of filter blocks are configured to achieve a lowpass filter transfer function.

13. The system of claim 12 wherein the plurality of filter blocks are configured to achieve a bandpass filter transfer function.

14. The system of claim 12 wherein the plurality of filter blocks are configured to achieve a high pass filter transfer function.

15. A filter a system comprising:

a detector for detecting a peak of a signal;

a log domain filter having a variable dynamic range window, the log domain filter comprises a plurality of filter blocks and complex poles; and an adjuster for adjusting the dynamic range window of the log domain filter responsive to the detected peak, said adjuster comprising a biasing unit for biasing the signal.

* * * * *